United States Patent
Oldstead et al.

(10) Patent No.: US 6,218,824 B1
(45) Date of Patent: Apr. 17, 2001

(54) SIMPLIFIED USER INTERFACE AND CONTROL SYSTEM FOR A MULTIMETER

(75) Inventors: H. Wayne Oldstead, Beaverton; Frank Goovaerts, Banks; Theodore G. Nelson, Portland; Michael R. Engbretson, Beaverton; J. Steve Lyford, Portland; Jerry L. Wrisley, Beaverton; Charles L. Saxe, Portland; James L. Williamson, Aloha, all of OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/074,444

(22) Filed: May 7, 1998

(51) Int. Cl.[7] ............................. G01R 15/08; G01R 1/00
(52) U.S. Cl. ........................................ 324/115; 324/114
(58) Field of Search ...................... 324/114, 115, 324/116, 110, 76.11, 758, 103 R, 156, 157

(56) References Cited

U.S. PATENT DOCUMENTS

| | | | |
|---|---|---|---|
| 4,825,392 | * | 4/1989 | Freeman ............................. 364/550 |
| 5,166,599 | * | 11/1992 | Hochreuther et al. ............... 324/115 |
| 5,243,275 | * | 9/1993 | Nakazawa et al. .................. 324/110 |
| 5,508,607 | * | 4/1996 | Gibson .............................. 324/121 R |
| 5,530,373 | * | 6/1996 | Gibson et al. ....................... 324/758 |
| 5,619,129 | * | 4/1997 | Kamiya .............................. 324/115 |

FOREIGN PATENT DOCUMENTS 5-60797 * 3/1993 (JP) ..................................... 324/115

* cited by examiner

Primary Examiner—Safet Metjahic
Assistant Examiner—Minh Tang
(74) Attorney, Agent, or Firm—Thomas F. Lenihan

(57) ABSTRACT

A simplified user interface for an electronic test and measurement device comprises an arrangement of a segmented LCD device and a plurality of keys used to implement a softkey system, in combination with a single AMPs input connector and a rotary selector having only a single position for each basic kind of parameter to be measured. The segmented LCD device includes, at each location adjacent to a key, a plurality of segments representing a vertically-arranged list of functions to be controlled. In one embodiment of the invention, the housing of the electronic test and measurement device is fabricated to have finger-like projections overlaying a portion of the LCD screen for creating the appearance of the continuation of displayed LCD softkey separation lines.

3 Claims, 3 Drawing Sheets

SIMPLIFIED USER INTERFACE AND CONTROL SYSTEM FOR A MULTIMETER

FIELD OF THE INVENTION

The subject invention concerns the field of user interfaces and control systems for multimeters in general, and specifically concerns multimeters having softkeys.

BACKGROUND OF THE INVENTION

A multimeter, as the name suggests, is an instrument which is capable of measuring a number of different parameters, such as voltage, current, resistance, and the frequency of an input signal. Modern multimeters have become quite advanced and are also sometimes capable of measuring capacitance, duty factor, and temperature. It is also common for multimeters to automatically select the proper range for display.

Unfortunately, the user interface on the front panels of these existing multifunction multimeters is becoming more and more cluttered, confusing, and difficult to use. One reason for this clutter is the number of buttons (i.e., keys) and input terminals required to select and exercise the available features. For example, it is common for selector knobs to have three positions for the AMPS function (i.e., A, mA, and μA), and at least two positions for the Volts function (AC and DC). There are usually two AMPs input connectors (i.e., AMPs and mA) in addition to the VOLTs and COMMON input connectors. Thus, the user is presented with a confusing multitude of legends, buttons and knobs, and inputs, from which he must choose to exercise the desired function.

It is known to use so-called "softkeys", to reduce the number of buttons needed, by changing the legend on a display screen adjacent to the button. The display device has to be versatile enough to display a number of different softkey legends. Such systems typically employ a CRT or a dot matrix LCD so that the area immediately adjacent to the button can be erased and a new legend displayed when the key function is to be changed. Unfortunately, in a handheld device such as a multimeter, a CRT is impractical for reasons of weight, size, and durability, and a dot matrix LCD is impractical for the added complexity and expense that its use would entail. What is needed is a user interface for a multimeter which retains the multifunction capability but overcomes the above noted difficulties.

SUMMARY OF THE INVENTION

A simplified user interface for an electronic test and measurement device comprises an arrangement of a segmented LCD device and a plurality of keys used to implement a softkey system, in combination with a single AMPs input connector and a rotary selector having only a single position for each parameter to be measured. The segmented LCD device includes, at each location adjacent to a key, a plurality of segments representing a vertically-arranged list of functions to be controlled.

Another aspect of the invention is that a single amps connector is used to receive the current to be measured, and the measurement takes place over a range extending from nanoamperes to amperes.

In one embodiment of the invention, the housing of the electronic test and measurement device is fabricated to have finger-like projections overlaying a portion of the LCD screen for creating the appearance of the continuation of displayed LCD softkey separation lines.

DETAILED DESCRIPTION OF THE INVENTION

Figure 1:
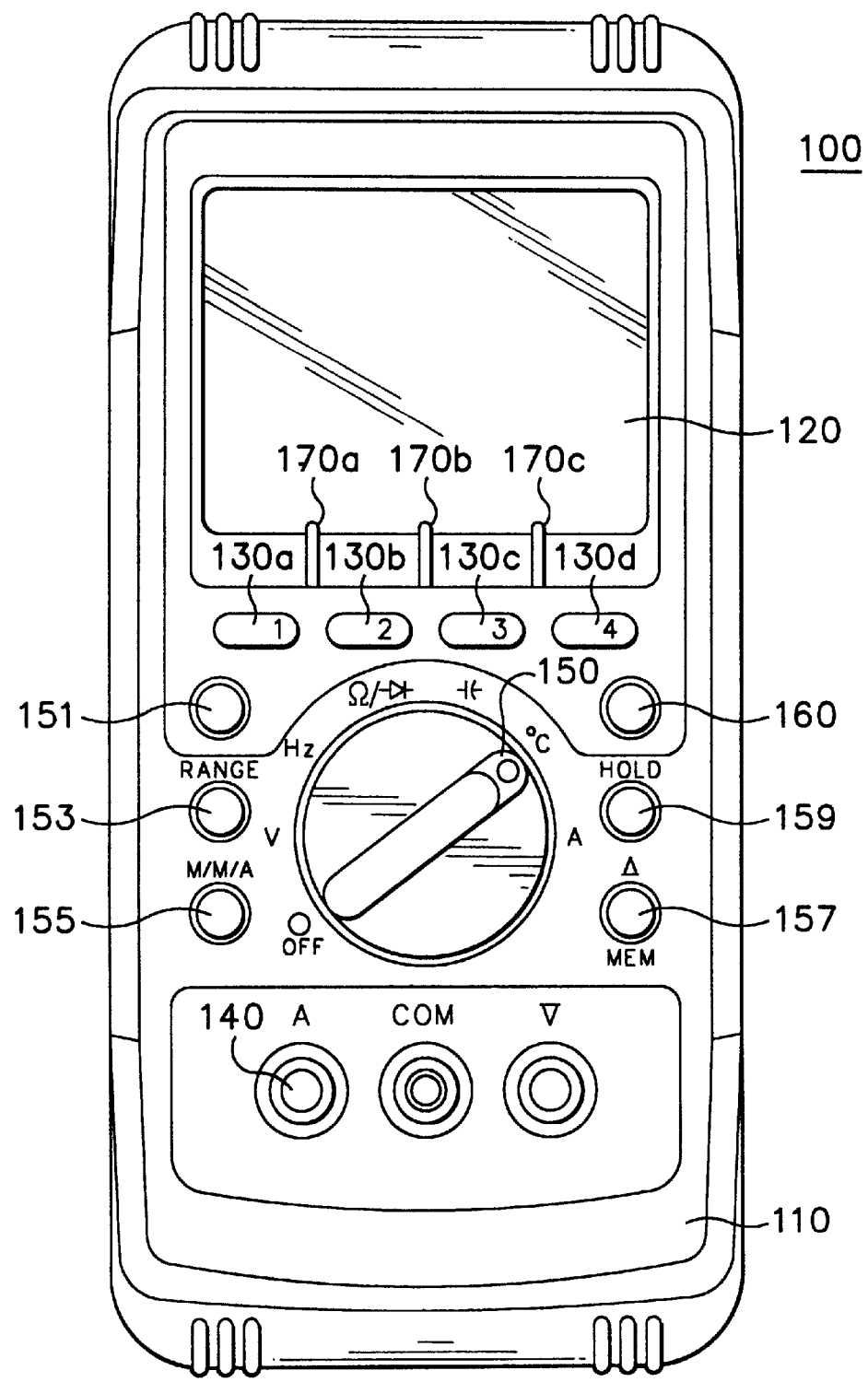
FIG. 1 shows a digital multimeter (DMM) in accordance with the invention.

Referring to FIG. 1, a digital multimeter DMM 100 having a simplified user interface comprises a housing or case 110, and an LCD display 120, and softkeys 130a, 130b, 130c, and 130d. It is also important to note the DMM of FIG. 1 requires only a single input connector 140, labelled A, for receiving current to be measured by the AMPs function. It is important to note that the current measurement is made over a range extending from nanoamperes to amperes. Note also that rotary function selection switch 150 has only a single position for each function to be exercised. There are only five other buttons 151, 153, 155, 157, and 159 which are used for accessing further features of the DMM. A sixth button 160 activates a backlight to provide easier viewing in low light conditions. The combination of these elements provides a clean, easy to use, and non-intimidating human interface.

Figure 2:
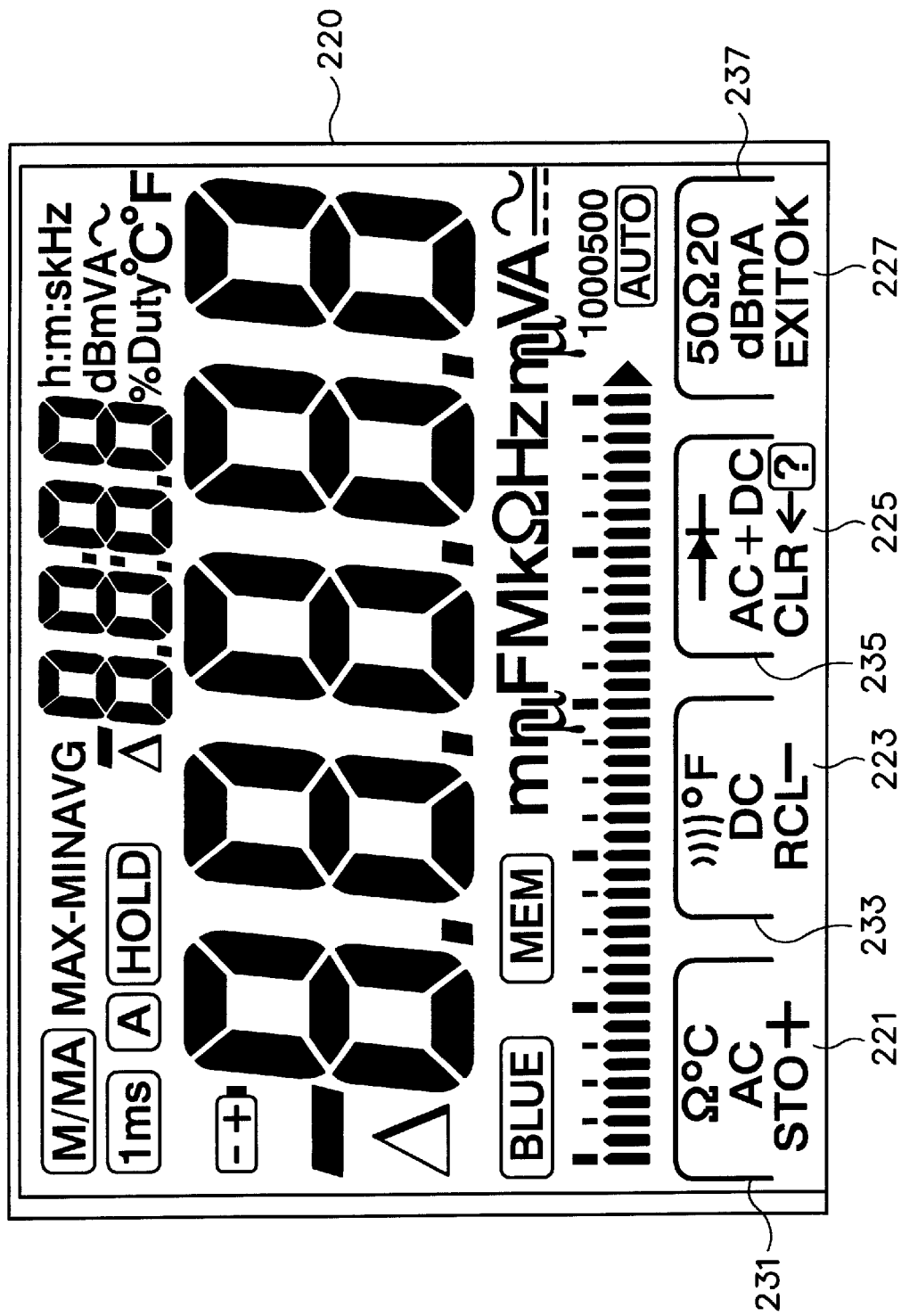
FIG. 2 shows a segmented LCD display for use with the multimeter of FIG. 1.

A segmented LCD display 220 showing all segments illuminated is shown in FIG. 2. LCD display 220 is an illuminated illustration of LCD display 120 of FIG. 1 highlighting the large number and complex arrangement of segments required to implement a modern DMM. In fact, the number of segments is actually greater than the number of addressable points. That is, the addressing arrangement for this particular segmented LCD display is four by forty addressable points, while the actual number of segments needed was one hundred eighty. This problem was overcome with the realization that in certain functions some of the segments are always illuminated in pairs, and that those segments could be connected together.

As noted above, a dot matrix LCD can be erased and rewritten in the area adjacent to a button to create a "softkey" which varies its function in accordance with a displayed legend. A segmented display cannot be erased; its segments are fixed in place. In order to solve this problem, it was decided to provide a vertically-arranged list of softkey legends 221, 223, 225, and 227 in the area immediately above the softkey buttons 130a, 130b, 130c, 130d. Only one legend in each vertical group would be illuminated at a given time. In order to associate these groups of legends with a particular key, one would think that one could encircle the legends with a line segment. Unfortunately, this is not possible because of the fact that in a segmented LCD display device, lines cannot cross. That is, both the segment address lines and the segment display lines must be carefully routed so as not to touch. Thus, if the group of legend segments were encircled by a line segment, the address lines to the individual legend segments would be unable to cross the encircling line segment, resulting in inoperative legend segments.

This obstacle was overcome by drawing a line segment 231, 233, 235, 237 around the softkey legend segments on only three sides, as shown in FIG. 2. This enables the address lines to reach the softkey legend segments without crossing any display lines, while still providing a grouping symbol around the legends to associate them with the same key. Unfortunately, the open bottom of the partially encircling line segment was felt to be less aesthetically pleasing than a fully encircling line segment. This problem was overcome by employing finger-like projections 170*a*, 170*b*, 170*c* which slightly overlay the screen area, and mask the fact that the encircling is incomplete. The result is that the finger-like projections in combination with the observable portion of the LCD partially-encircling line segments "fool the eye" and present a more aesthetically pleasing appearance.

The use of a segmented LCD device caused yet another problem to arise in association with the refresh rate of the LCD. When considering the use of a segmented LCD for a multimeter display device, the large number of segments required quickly becomes apparent. Each segment must be refreshed repeatedly, and the large number of segments requires a substantial amount of time to completely refresh all the segments and return to the first one to begin again. Moreover, it was found that care had to be taken to provide a suitable refresh rate in order to avoid an annoying beat between the illumination of the segments and the pulsation of normal room lighting due to the 50 Hz or 60 Hz power line frequency.

Figure 3:
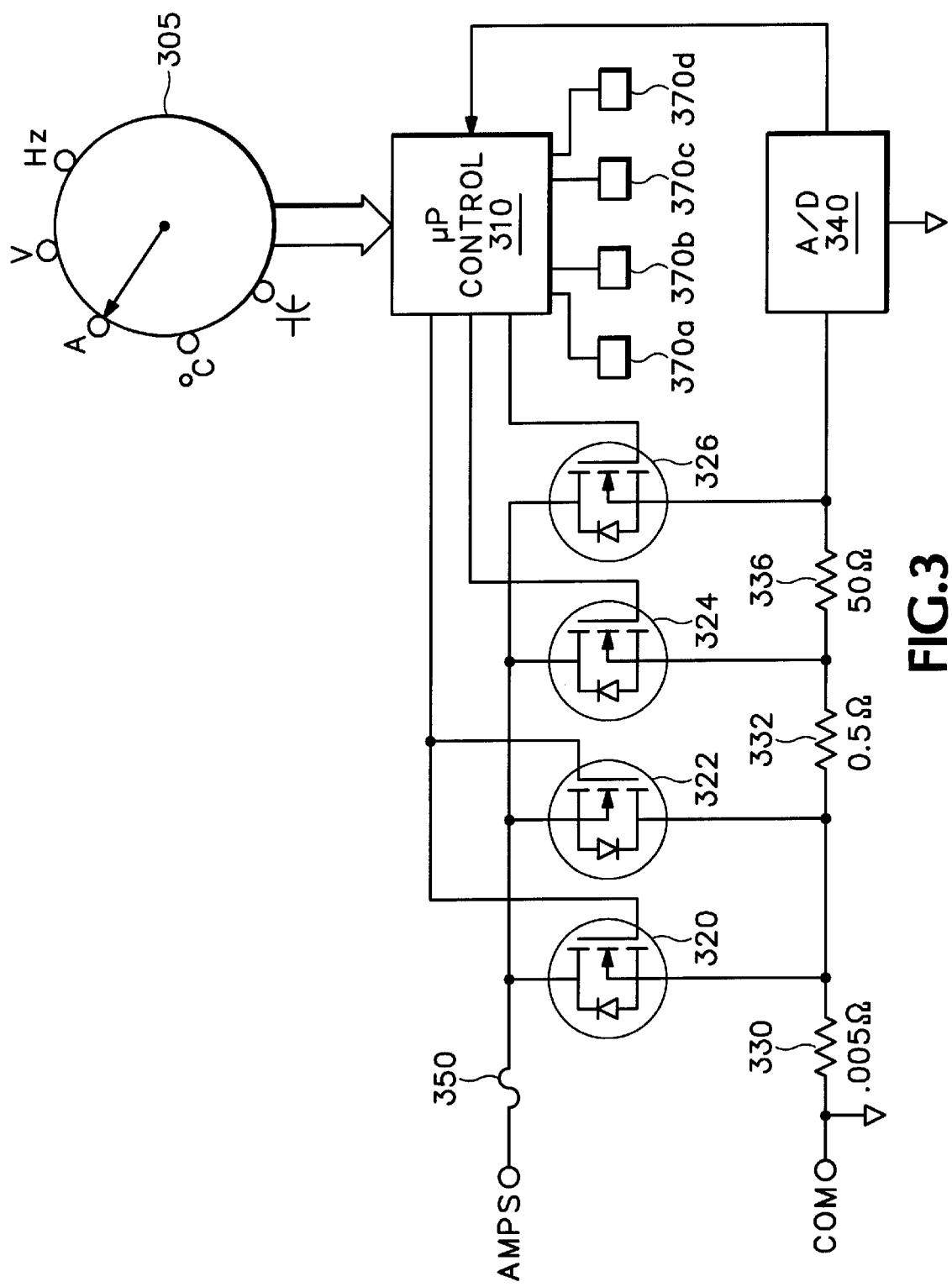
FIG. 3 shows an input switching arrangement for the AMPs connector of the multimeter of FIG. 1.

Referring to FIG. 3, a rotary switch 305 for selection of measurement functions can be simplified to select only the basic kind of function (for example, AMPs, VOLTs), instead of the more usual specific function (for example, AMPs, mA,), because the signal to be measured is not coupled through the rotary switch. Rather, rotary switch 305 is an input to a control microprocessor 310 which controls the actual measurement. Four softkey buttons (i.e., switches) 370*a*, 370*b*, 370*c*, and 370*d* are coupled to microprocessor 310 and are used to further refine the input to microprocessor 310 to select specific desired measurement functions. In response to rotation of rotary switch 305 to the AMPs position, and the pressing of one of softkey buttons 370*a*, 370*b*, 370*c*, and 370*d*, control microprocessor 310 controls switching FETs 320, 322, 324, and 326 to select the proper measurement range in cooperation with scaling resistors 330, 332, and 336. The signal current applied at the single AMPs input flows through fuse 350, one or more of switching FETs 320, 322, 324, and 326 and one or more of scaling resistors 330, 332, and 334 to ultimately develop a voltage at the input of A/D converter 340 that is representative of the magnitude of the current being measured. The digital representation of the A/D input signal is coupled to microprocessor controller 310 for display on display screen 220 of FIG. 2.

Each of the FET switches of FIG. 3 includes a bypass diode for input protection. It is a characteristic of these diodes that they are of high quality in that they can handle high currents, and that they exhibit extremely low reverse leakage. Note that switching FETs 320 and 322 are both N-channel FETs, but that FET 322 is connected in reverse (i.e., oppositely) to its usual orientation. That is, the source terminal of FET 320 is coupled directly to the drain terminal of FET 322, the drain terminal of FET 320 is coupled directly to the source terminal of FET 322, and the gate terminals are coupled together and driven by microprocessor controller 310. The purpose of this reverse orientation of FET 322 is to utilize the internal protection diode to protect against the opposite polarity surges from those handled by the diode in FET 320. The circuit of FIG. 3 also has the added benefit that FETs 320 and 322 are operated in parallel and thereby lower switch resistance in the high current range. A prior art version of this circuit used a power diode in place of FET 322. The power diode of this prior circuit did not contribute to the lowering of the switch resistance, as mentioned above, because it was not activated in parallel with FET 320. Moreover, power diodes having the capability to handle surge currents of amps, undesirably exhibit relatively high leakage currents of approximately 100 nA, which would adversely affect current measurements on the lower ranges. As noted above, the subject apparatus is capable of measuring in the nanoampere to ampere range, and the use of the oppositely-connected FET, rather than the power diode, allows the nanoampere measurement without the adverse effects caused by reverse current leakage.

It is important to note that the cooperation between a rotary switch having only a single selection for each major function, a segmented display with attendant softkeys, and a single AMPs input provides the user with a desirably uncluttered, and particularly easy-to-use interface.

The term "control microprocessor", as applied to element 310 is intended to encompass microcomputers, and other forms of controllers such as dedicated hardware controllers including ASICs.

While the invention has been described with respect to a digital multimeter, it is herein recognized that it would is also applicable to other types of test and measurement equipment, and such modification is deemed to lie within the scope of the following claims.

What is claimed is:

1. A digital multimeter, comprising:
   a rotary switch having a plurality of positions, each of said positions selecting a respective basic kind of measurement function to be performed;
   a segmented LCD display device for displaying a value determined by performing one of said measurement functions, and for displaying along an edge of said display device at least one group comprising a plurality of legends;
   a key mounted on a housing of said multimeter substantially at said edge of said display device and proximate to said plurality of legends, said key being operable by a user to further define said measurement function to be performed;
   a single input terminal for receiving current for measurement in a plurality of measurement ranges, wherein said measurement ranges occupy a range extending from nanoamperes to amperes;
   a controller for generating control signals for selecting said measurement ranges; and
   a plurality of controlled switches for selecting said measurement ranges, said plurality of controlled switches operating under control of said controller; wherein
   each of said plurality of controlled switches is an FET switch; and wherein
   for a particular measurement range, a pair of said FET switches is operated substantially simultaneously, and one of said pair of FET switches is connected in a reverse orientation with respect to the other.

2. A digital multimeter, comprising:
   a rotary switch having a plurality of positions, each of said positions selecting a respective basic kind of measurement function to be performed;
   a segmented LCD display device for displaying a value determined by performing one of said measurement functions, and for displaying along an edge of said display device at least one group comprising a plurality of legends;
   a key mounted on a housing of said multimeter substantially at said edge of said display device and proximate to said plurality of legends, said kev being operable by a user to further define said measurement function to be performed;

a single input terminal for receiving current for measurement in a plurality of measurement ranges, wherein said measurement ranges occupy a range extending from nanoamperes to amperes; and a controller for generating control signals for selecting said measurement ranges and for controlling displays of said LCD display device; wherein, said housing of said multimeter includes a plurality of finger-like projections overlaying a portion of said LCD display device adjacent said plurality of legends, said plurality of legends being arranged in a substantially vertical list, said list being bordered on top and on each side by a single line segment, said finger-like projections being aligned with an end of said line segment to mask an absence of a portion of said line segment.

3. The digital multimeter of claim 2 further including a plurality of controlled switches for selecting measurement ranges, said plurality of controlled switches operating under control of said controller, wherein each of said plurality of controlled switches is an FET switch; and wherein for a particular measurement range, a pair of said FET switches is operated substantially simultaneously, and one of said pair of FET switches is connected in a reverse orientation with respect to the other.

* * * * *